Figures 1, 2, 3:
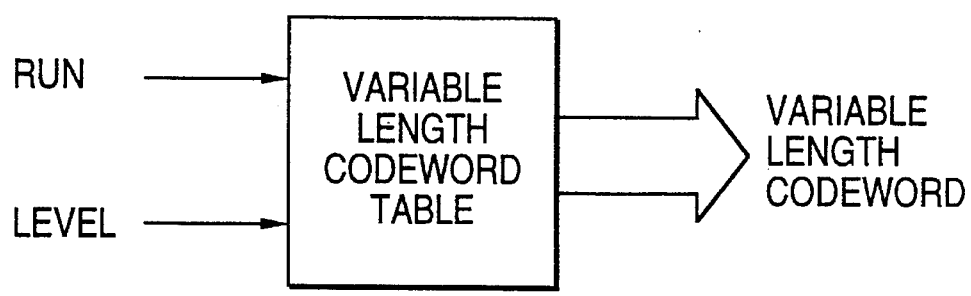

United States Patent

Bjøntegaard

[11] Patent Number: 5,579,413
[45] Date of Patent: Nov. 26, 1996

[54] PICTURE DATA ENCODING METHOD

[75] Inventor: Gisle Bjøntegaard, Myrvoll, Norway

[73] Assignee: Teledirektoratets Forskningsavdeling, Kjeller, Norway

[21] Appl. No.: 302,660

[22] PCT Filed: Mar. 10, 1993

[86] PCT No.: PCT/NO93/00038

§ 371 Date: Sep. 8, 1994

§ 102(e) Date: Sep. 8, 1994

[87] PCT Pub. No.: WO93/18616

PCT Pub. Date: Sep. 16, 1993

[30] Foreign Application Priority Data

Mar. 11, 1992 [NO] Norway ................................. 92.0956

[51] Int. Cl.$^6$ ........................................................ G06K 9/36
[52] U.S. Cl. ........................... 382/248; 342/420; 358/432; 387/246; 387/250
[58] Field of Search ............................... 382/56, 244, 245, 382/246, 247, 248, 250, 251; 348/395, 404, 420, 394, 400, 401, 403; 358/427, 432, 433

[56] References Cited

U.S. PATENT DOCUMENTS 4,937,573  6/1990  Silvio et al. .
5,107,345  4/1992  Lee .......................................... 358/432
5,162,795  11/1992  Shirota .

FOREIGN PATENT DOCUMENTS 1045113  10/1991  European Pat. Off. .

Primary Examiner—Joseph Mancuso
Attorney, Agent, or Firm—Wenderoth, Lind & Ponack

[57] ABSTRACT

When transformed and quantized blocks of picture data are encoded, a block being constituted by a matrix of coefficients, the events within each block to be encoded comprise firstly a run indicating the number of zero-coefficients in the clock between a current non-zero coefficient and the previous non-zero coefficient, and secondly, the size of the current non-zero coefficient of the block. Each event is, in accordance with the invention, completed by adding a third parameter which indicates whether the current non-zero coefficient is the last non-zero coefficient of the block. Hence, each event is represented as a three-dimensional quantity.

5 Claims, 2 Drawing Sheets

| 1 | 2 | 6 | 7 | 15 | 16 | 28 | 29 |
|---|---|---|---|----|----|----|----|
| 3 | 5 | 8 | 14 | 17 | 27 | 30 | 43 |
| 4 | 9 | 13 | 18 | 26 | 31 | 42 | 44 |
| 10 | 12 | 19 | 25 | 32 | 41 | 45 | 54 |
| 11 | 20 | 24 | 33 | 40 | 46 | 53 | 55 |
| 21 | 23 | 34 | 39 | 47 | 52 | 56 | 61 |
| 22 | 35 | 38 | 48 | 51 | 57 | 60 | 62 |
| 36 | 37 | 49 | 50 | 58 | 59 | 63 | 64 |

| 3 | 0 | 0 | 0 | 0 | 0 | 0 | 0 |
|---|---|---|---|---|---|---|---|
| 2 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 1 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

|  | BLOCK NUMBER | | | | | |
|---|---|---|---|---|---|---|
| COEFFICIENT NUMBER | 1 | 2 | 3 | 4 | 5 | 6 |
| 1 | 5 | 7 | 3 | 1 | 4 | 8 |
| 2 | 2 | 0 | 0 | 1 | 0 | 3 |
| 3 | 0 | 3 | 2 |   | 2 | 0 |
| 4 | 1 | 1 |   |   |   | 2 |
| 5 |   | 1 |   |   |   |   |

PICTURE DATA ENCODING METHOD

The present invention relates to a method for encoding picture data, and more specifically encoding of transformed and quantized blocks of picture data, optionally groups of such blocks.

Lately digital compression techniques have been put into use in order to reduce the bit consumption in the representation of single pictures or picture sequences (live pictures). These techniques are used e.g. in picture telephony. The picture telephony encoding technique itself is standardized in the international telecommunication organization CCITT. The standardizing work was conducted by an expert group under CCITT SG XV WP XV/1, and the resulting recommendation has the number J.261. Also within the international standardizing organization ISO work has been done to provide standards for encoding both live pictures and single pictures (still pictures). The groups responsible for these activities have designations ISO/IEC JTC1/SC2/WG11 (for live pictures) and ISO/IEC JTC1/SC2/WG10 (for still pictures). The methods which are usually called MPEG and JPEG, are described in respectively ISO/IEC JTC1 Committee Draft 10918 and ISO/IEC JTC1 Committee Draft 11172.

A common feature for all these techniques is that blocks of picture values are processed. By applying a suitable transformation to the block, the result will be a block in the transform plane where the energy content is concentrated toward a block corner. Usually a discrete cosine transform (DCT) is used. All the three above mentioned methods use DCT. The transformed blocks are quantized, and the quantized values are thereafter encoded with a so-called "variable length code".

While the quantization introduces errors in the reconstructed signal (i.e. is irreversible), the variable length type encoding is a reversible process. This means that it is possible to reconstruct exactly that which has been encoded with a variable length code. The purpose of using encoding of the variable length type, is to reduce the data amount transmitted, without changing the information content. Events of small probability are encoded with many bits, while events of great probability are encoded using few bits. The so-called "Huffman encoding" is an example of encoding of the variable length type. It is a condition for improvement when the variable length coding is used, that different events occur with different probabilities. Thus, DCT transformed blocks of picture data are suitable for the variable length type encoding.

It is possible to use one or several input values to the variable length code. The case where several values are used can be called a multi-dimensional variable length code. In the coding technique which is standardized in CCITT, and in the encoding methods now presented for standardization within the ISO, two-dimensional variable length codes are used. The quantized transform coefficients in the transformed block are processed in a certain consecutive order. One input value is the level of the quantized transform coefficient, while the second value is the number of transform coefficients equal to zero since the last encoded (non-zero) coefficient. Thus, only non-zero coefficients are encoded in this case. (Encoding in this manner, i.e. only encoding values which are different from a given value, and indicating "travel length" in the block since the last encoded value, is termed "run length coding".) When the last non-zero coefficient in the block has been coded, a codeword is transmitted (the codeword is here termed EOB, "end of block") to signal that no more non-zero coefficients remain in the block. The use of EOB is suitable because it is often very many zero coefficients after the last non-zero coefficient in a block, unless the block is very small. The enclosed FIG. 1 shows the consecutive order for processing coefficients in a block, as it is conducted according to the CCITT standard algorithm for picture telephony.

Further, FIG. 2 shows a block containing quantized coefficients and the resulting events to be encoded when the CCITT standard algorithm is used. The transition from EVENT to a variable length codeword can be done merely by using a look-up table. The values of RUN and LEVEL are entered in a table, and provide the codeword for this event. This is illustrated in a schematical manner in the enclosed FIG. 3.

a) Transforming picture data blocks using DCT, b) quantizing the transform coefficients and c) variable length encoding them as here described, constitute three techniques which can be used as respective single techniques. However, a) and b) are methods which when applied to picture data, provide a result which is rather well suited for method c).

The method in accordance with the invention is directed to encoding transformed and quantized blocks of picture data, optionally groups of such blocks, where a block is constituted by a matrix of coefficients, and where the energy content in a block is increasing toward a block corner. The events within each block or group of blocks to be encoded, include (a) a run indicating the number of zero-coefficients in the block/group between a current non-zero coefficient and the previous non-zero coefficient, where the run direction in the block/group is predetermined, and (b) the size of the current non-zero coefficient in the group/block.

Each event is listed in a series of successive events, and the particular event is thereafter re-encoded via a look-up table to a variable length code. The method is particularly characterized in that each event is completed by (c) a third parameter indicating whether the current non-zero coefficient is the last non-zero coefficient in the block, the third parameter having only two possible values, each event thereby being represented as a three-dimensional quantity.

In one embodiment of the invention, the run direction within the block follows the CCITT standard algorithm for block coefficient encoding.

In a preferred embodiment, a group of blocks is encoded by arranging the group as a matrix of all coefficients in each block up to the last non-zero coefficient in the block, in a column, and with juxtaposed columns block by block.

In the last mentioned case preferentially a run direction is used within the group matrix which is simple row by row, while ensuring that group matrix positions without any coefficient do not count when calculating the run value.

A closer study will now be made regarding the particular features of the invention, while referring to the enclosed drawings which indicate example embodiments of the method in accordance with the invention.

Figures 4, 5:
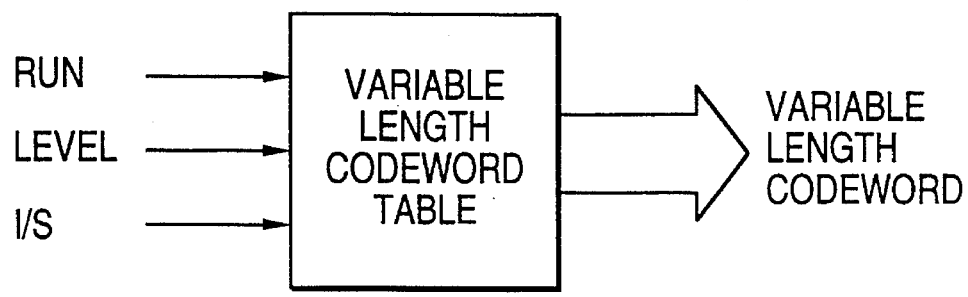

FIG. 1 shows, as previously mentioned, an example of a consecutive order for encoding coefficients in accordance with the CCITT, FIG. 2 shows an example of two-dimensional variable length coding used in CCITT, FIG. 3 shows in a schematic manner the use of a look-up table for codewords with a two-dimensional variable length code, FIG. 4 shows three-dimensional variable length coding with several blocks, and FIG. 5 shows in a schematic manner the use of a look-up table for codewords with a three-dimensional variable length code.

The new variable length code will use three input values;
1. the value of the transform coefficient (which is different from zero),
2. the run length (the number of zero coefficients since the last non-zero coefficient),
3. a parameter to show whether or not the coefficient is the last non-zero coefficient in the block.

Related to the standard algorithms which have been described above, the values indicated in items 1 and 2 above can be found in a corresponding manner. The difference is that the codeword for the last non-zero coefficient is integrated in the variable length code itself, i.e. it does not appear as a separate codeword. The purpose hereof is to enable a better adaption of the codeword length for different events, to the probability that a particular event should occur. (Please note: An event is here defined as a combination of the values 1, 2 and 3 above.) Hence it should be possible to transmit the same information using a lesser amount of data.

When looking at FIGS. 1 and 2, the following sequence of events will be found to need encoding with a three-dimensional variable length code:

---

EVENT = (run, level, not last non-zero coeff. (I)/
last non-zero coeff. (S))
EVENTS = (0,3,I) (1,2,I) (7,1,S)

---

The application which has been described above, is based upon execution of the encoding for one block at a time. Another application is based upon encoding several blocks at the same time. One faces the same starting point as before, but in this case there is more than one block which have been transformed and quantized, and which are to be encoded one at a time.

One may visualize that all coefficients in a block are laid down in a consecutive order one after the other (i.e. from coefficient no. 1 to coefficient no. 64 for the situation appearing in FIG. 1). This is done for all blocks which are to be encoded simultaneously. It is assumed that only blocks containing one or several non-zero coefficients are to be encoded. It is also necessary to have knowledge of the number of these "non-zero blocks", FIG. 4 shows an example of six blocks, wherein the highest number of a non-zero coefficients is 5 (block 2).

Thereafter the three-dimensional variable length code is used, and encoding is executed in consecutive order with coefficient no. 1 in block 1-6, thereafter coefficient no. 2 in block 1-6 etc. Coefficient no. 2 in block 4 in the last non-zero coefficient in block 4. The input values to the variable length code for this coefficient will be (run=2, level=1,S (the last non-zero coefficient)). The information regarding the fact that this was the last non-zero coefficient of block 4, is stored. When encoding coefficients with a higher number, block 4 will not be taken into consideration, i.e. block 4 will then not contribute to an increase of the RUN value.

If FIG. 4 is used to examplify this situation, the following events will be the ones to be encoded:

---

EVENT = (run, level, not last non-zero coeff. (I)/
last non-zero coeff. (S))
EVENTS = (0,5,I) (0,7,I) (0,3,I) (0,1,I) (0,4,I) (0,8,I) (0,2,I)
(2,1,S) (1,3,I) (1,3,I) (0,2,S) (0,2,S) (1,1,S) (0,1,I)
(0,2,S) (0,1,S)

---

The codewords are found by use of a look-up table, and in this connection it is referred to the schematical representation of FIG. 5. The three input parameters, i.e. run, level and "I/S" parameter, produce one single output value which represents the three-dimensional event.

I claim:

1. A method of converting a transformed and quantized picture block data signal into a variable length encoded data signal, the picture block data signal indicative of plural transformed and quantized two-dimensional picture blocks each defined by a corresponding matrix of zero and non-zero quantized transform coefficients in which the non-zero quantized transform coefficients thereof are concentrated in a block corner, said method comprising:

converting each picture block of the picture block data signal into a series of successive event data indicative of a sequence of the quantized transform coefficients along a predetermined run direction within each picture block, each event data containing three data parameters, a first of the three data parameters being a run length indicative of a number of the zero quantized transform coefficients along the predetermined run direction between a current non-zero quantized transform coefficient and an immediately preceding non-zero quantized transform coefficient, a second of the three data parameters being a value of the current non-zero quantized transform coefficient, and a third of the three data parameters indicating whether the current non-zero quantized transform coefficient is a final non-zero quantized transform coefficient along the predetermined run direction within each block; and applying the series of successive event data to a predetermined codeword look-up data table to convert the series of successive event data to corresponding variable length codewords which are output as the variable length encoded data signal.

2. A method as claimed in claim 1, wherein the predetermined run direction conforms to the CCITT standard algorithm for block coefficient encoding.

3. A method of converting a transformed and quantized picture block data signal into a variable length encoded data signal, the block data signal indicative of plural transformed and quantized two-dimensional picture blocks each defined by a corresponding matrix of zero and non-zero quantized transform coefficients in which the non-zero quantized transform coefficients thereof are concentrated in a block corner, said method comprising:

grouping a predetermined plurality of the picture blocks of the picture block data signal into a group matrix of the quantized transform coefficients of the predetermined plurality of picture blocks;

converting a group matrix into a series of successive event data indicative of a sequence of the quantized transform coefficients along a first predetermined run direction within said group matrix, each event data containing three data parameters, a first of the three data parameters being a run length indicative of a number of the zero quantized transform coefficients along the first predetermined run direction within said group matrix between a current non-zero quantized transform coefficient and an immediately preceding non-zero quantized transform coefficient, a second of the three data parameters being a value of the current non-zero quantized transform coefficient, and a third of the three data parameters indicating whether the current non-zero quantized transform coefficient is a final non-zero quantized transform coefficient along a second predetermined run direction within each picture block of the plurality of picture blocks grouped into the group matrix; and applying the series of successive event data to a predetermined codeword look-up data table to convert the series of successive event data to corresponding variable length codewords which are output as the variable length encoded data signal.

4. A method as claimed in claim 3, wherein said grouping step includes:

forming, for each picture block, a column of quantized transform coefficients beginning with a first quantized transform coefficient and ending with a last non-zero quantized transform coefficient along the second predetermined run direction within each picture block;

juxtaposing the columns of quantized transform coefficients formed from each of the predetermined plurality of picture blocks to obtain the group matrix.

5. A method as claimed in claim 4, wherein the first predetermined run direction is row by row within the group matrix, and wherein only actual zero quantized transform coefficients of the group matrix are included in the run length of the first parameter.

* * * * *